United States Patent
Tsai et al.

(10) Patent No.: US 8,253,499 B2
(45) Date of Patent: Aug. 28, 2012

(54) CHARGE PUMP AND PHASE DETECTION APPARATUS, PHASE-LOCKED LOOP AND DELAY-LOCKED LOOP USING THE SAME

(75) Inventors: Meng-Ting Tsai, Taichung (TW); Kun-Ju Tsai, Taichung (TW); Yung-Chih Liang, Zhonghe (TW)

(73) Assignee: Industrial Technology Research Institute, Hsinchu (TW)

( * ) Notice: Subject to any disclaimer, the term of this patent is extended or adjusted under 35 U.S.C. 154(b) by 3 days.

(21) Appl. No.: 13/012,512

(22) Filed: Jan. 24, 2011

(65) Prior Publication Data
US 2012/0139650 A1   Jun. 7, 2012

(30) Foreign Application Priority Data
Dec. 2, 2010  (TW) ................ 99141979 A

(51) Int. Cl.
  *H03L 7/085*   (2006.01)
  *H03L 7/089*   (2006.01)
  *H03L 7/093*   (2006.01)
(52) U.S. Cl. ............ 331/17; 331/1 R; 331/25; 327/157; 327/536
(58) Field of Classification Search .......... 327/148, 327/157, 536; 331/1 R, 14, 16, 17, 25; 375/374, 375/375
See application file for complete search history.

(56) References Cited

U.S. PATENT DOCUMENTS

| | | | |
|---|---|---|---|
| 6,262,610 B1 | 7/2001 | Lo et al. | |
| 6,680,874 B1 * | 1/2004 | Harrison | 365/194 |
| 6,704,383 B2 | 3/2004 | Lee et al. | |
| 6,710,665 B2 | 3/2004 | Maneatis | |
| 6,778,026 B2 * | 8/2004 | Cheah et al. | 331/17 |
| 6,853,254 B2 * | 2/2005 | Li | 331/16 |
| 6,919,746 B2 * | 7/2005 | Suzuki | 327/157 |

(Continued)

FOREIGN PATENT DOCUMENTS

TW   200522526   7/2005

(Continued)

OTHER PUBLICATIONS

Benyong Zhang et al., "A Fast Switching PLL Frequency Synthesizer With an On-Chip Passive Discrete-Time Loop Filter in .25-μm CMOS", IEEE Journal of Solid-State Circuits, Jun. 2003, pp. 855-865, vol. 38, No. 6.

(Continued)

*Primary Examiner* — Levi Gannon
(74) *Attorney, Agent, or Firm* — Muncy, Geissler, Olds & Lowe, PLLC

(57) ABSTRACT

A charge pump includes a first current source, a second current source, a first switch, a second switch, a third switch, a fourth switch, a reset switch, an inverse reset switch and a capacitance. The first and third switches have first terminals coupled to the first current source. The second and fourth switches have first terminals coupled to the second current source. The first, second and reset switches have second terminals coupled to a first terminal of the inverse reset switch. The reset switch has a first terminal coupled to second terminals of the third and fourth switches. The first and second switches are respectively controlled by first and second control signals, the third and fourth switches are respectively controlled by inverse signals of the first and second control signals, and the inverse reset switch is controlled by the inverse reset signal.

18 Claims, 6 Drawing Sheets

U.S. PATENT DOCUMENTS

2009/0039929 A1* 2/2009 Kossel ............ 327/157
2011/0199136 A1* 8/2011 Tsai ............... 327/157

FOREIGN PATENT DOCUMENTS

TW  I280726   5/2007
TW  99104795  2/2010

OTHER PUBLICATIONS

John G. Maneatis et al., "Self-Biased High-Bandwidth Low-Jitter 1-to-4096 Multiplier Clock Generator PLL", IEEE Journal of Solid State Circuits, Nov. 2003, pp. 1795-1803, vol. 38, No. 11.

Woogeun Rhee, "Design of High-Performance CMOS Charge Pumps in Phase-Locked Loops", 1999, pp. 545-548.

Jae-Shin Lee et al., "Charge pump with perfect current matching characteristics in phase-locked loops", Electronic Letters, Nov. 9, 2000, pp. 1907-1908, vol. 36, No. 23.

Kevin J. Wang et al., "Spurious Tone Suppression Techniques Applied to a Wide-Bandwidth 2.4 GHz Fractional-$N$ PLL", IEEE Journal of Solid-State Circuits, Dec. 2008, pp. 2787-2797, vol. 43, No. 12.

* cited by examiner

CHARGE PUMP AND PHASE DETECTION APPARATUS, PHASE-LOCKED LOOP AND DELAY-LOCKED LOOP USING THE SAME

This application claims the benefit of Taiwan application Serial No. 99141979, filed Dec. 2, 2010, the subject matter of which is incorporated herein by reference.

BACKGROUND

1. Technical Field

The invention relates in general to a charge pump and a phase detection apparatus, a phase-locked loop and a delay-locked loop using the same.

2. Background

In the increasingly precise chip application field nowadays, system-on chip (SoC) is an inevitable trend. However, internal circuits of the chip need a clean and steady clock generator to provide clock signals of the system. Therefore, a phase-locked loop (PLL) or a delay-locked loop (DLL) is widely applied to the clock generator of the system for generating low jitter clock signals that free from affected by manufacturing procedures. In the architecture of the PLL and DLL, a charge pump PLL and a charge pump DLL are architectures the field uses most often due to the simple implementation and easy production.

Because the charge pump is important in the analog block, the circuit design of the charge pump occupies high importance in the circuit architecture of the charge pump PLL and the charge pump PLL. The circuit design of the charge pump greatly affects performance of the PLL and the DLL. Hence, how to more improve efficiency, accuracy and speed of the charge pump circuit is an important issue in the design of the locked loop.

Referring to FIG. 1, a schematic illustration of an example of a traditional charge pump is shown. Take a charge pump 10 to be applied in a phase-locked loop to be exemplified, and it is not limited thereto. In the phase-locked loop, the charging/discharging timings are decided according to the switches SW1 to SW4 and SWR, and a reset operation is performed at an end of each reference period. If the charge current is not matched with the discharged current, the phase-locked loop will adjust the charging/discharging time to achieve charge equivalent and keeps locked. However, the charge pump 10 suffers from the problem of the unmatched currents and causes higher ripples as being locked. That is, there are spurs occurred in the frequency spectrum. When high frequency clock signals generated by the phase-locked loop have components of spurs and interference signals are just located on the same frequency offset, a frequency modulation may be caused and then the SNR of the signal is lowered.

Referring to FIG. 2, a schematic illustration of another example of a traditional charge pump is shown. To solve the problem of the unmatched currents, a charge pump 20 in FIG. 2 applies an operational amplifier OPA to force the charge current and the discharge current to be equal. However, the above-mentioned method may consume larger areas in the circuit architecture, and may further cause the charge pump 20 and application circuits thereof to be limited to a frequency bandwidth or a gain of the operational amplifier OPA.

SUMMARY

The disclosure is directed to a charge pump and a phase detection device, a phase-locked loop (PLL) and a delay-locked loop (DLL) using the same, capable of solving an unmatched current problem of the charge pump by an additional inverse reset signal and an additional inverse reset switch.

According to a first aspect of the present disclosure, a charge pump is provided. The charge pump provides an output signal according to a first control signal, a second control signal and an inverse reset signal. The charge pump includes a first current source, a second current source, a first switch, a second switch, a third switch, a fourth switch, a reset switch, an inverse reset switch and a capacitance. The first switch has a control terminal triggered by the first control signal and a first terminal coupled to the first current source. The second switch has a control terminal triggered by the second control signal and a first terminal coupled to the second current source. The third switch has a control terminal triggered by an inverse signal of the first control signal and a first terminal coupled to the first current source. The fourth switch has a control terminal triggered by an inverse signal of the second control signal and a first terminal coupled to the second current source. The reset switch has a first terminal coupled to second terminals of the third switch and the fourth switch and a second terminal coupled to second terminals of the first switch and the second switch. The inverse reset switch has a control terminal triggered by the inverse reset signal, a first terminal coupled to the second terminal of the reset switch and a second terminal coupled to an output terminal of the charge pump. The capacitance has a first terminal coupled to the output terminal of the charge pump and a second terminal coupled to a ground voltage.

According to a second aspect of the present disclosure, a phase detection apparatus is provided. The phase detection apparatus includes a phase frequency detector and a charge pump. The phase frequency detector detects a relationship between phases of a first frequency signal and a second frequency signal and outputs a first control signal, a second control signal and an inverse reset signal according to a detection result. The charge pump includes a first current source, a second current source, a first switch, a second switch, a third switch, a fourth switch, a reset switch, an inverse reset switch and a capacitance. The first switch has a control terminal triggered by the first control signal and a first terminal coupled to the first current source. The second switch has a control terminal triggered by the second control signal and a first terminal coupled to the second current source. The third switch has a control terminal triggered by an inverse signal of the first control signal and a first terminal coupled to the first current source. The fourth switch has a control terminal triggered by an inverse signal of the second control signal and a first terminal coupled to the second current source. The reset switch has a first terminal coupled to second terminals of the third switch and the fourth switch and a second terminal coupled to second terminals of the first switch and the second switch. The inverse reset switch has a control terminal triggered by the inverse reset signal, a first terminal coupled to the second terminal of the reset switch and a second terminal coupled to an output terminal of the charge pump. The capacitance has a first terminal coupled to the output terminal of the charge pump and a second terminal coupled to a ground voltage.

According to a third aspect of the present disclosure, a phase-locked loop is provided. The phase-locked loop includes a phase frequency detector, a charge pump, a voltage-controlled oscillator and a frequency divider. The phase frequency detector detects a relationship between phases of a first frequency signal and a second frequency signal and outputs a first control signal, a second control signal and an inverse reset signal according to a detection result. The charge pump includes a first current source, a second current source, a first switch, a second switch, a third switch, a fourth switch, a reset switch, an inverse reset switch and an element formed by capacitance and resistance in series. The first switch has a control terminal triggered by the first control signal and a first terminal coupled to the first current source. The second switch has a control terminal triggered by the second control signal and a first terminal coupled to the second current source. The third switch has a control terminal triggered by an inverse signal of the first control signal and a first terminal coupled to the first current source. The fourth switch has a control terminal triggered by an inverse signal of the second control signal and a first terminal coupled to the second current source. The reset switch has a first terminal coupled to second terminals of the third switch and the fourth switch and a second terminal coupled to second terminals of the first switch and the second switch. The inverse reset switch has a control terminal triggered by the inverse reset signal, a first terminal coupled to the second terminal of the reset switch and a second terminal coupled to an output terminal of the charge pump. The element, formed by the capacitance and the resistance in series, has a first terminal coupled to the output terminal of the charge pump and a second terminal coupled to a ground voltage. The voltage-controlled oscillator has an input terminal coupled to the output terminal of the charge pump. The frequency divider has an input terminal coupled to an output terminal of the voltage-controlled oscillator and output terminal for providing the second frequency signal to the phase frequency detector.

According to a fourth aspect of the present disclosure, a delay-locked loop is provided. The delay-locked loop includes a phase frequency detector, a charge pump and a voltage-controlled delay line. The phase frequency detector detects a relationship between phases of a first frequency signal and a second frequency signal and outputs a first control signal, a second control signal and an inverse reset signal according to a detection result. The charge pump includes a first current source, a second current source, a first switch, a second switch, a third switch, a fourth switch, a reset switch, an inverse reset switch and a capacitance. The first switch has a control terminal triggered by the first control signal and a first terminal coupled to the first current source. The second switch has a control terminal triggered by the second control signal and a first terminal coupled to the second current source. The third switch has a control terminal triggered by an inverse signal of the first control signal and a first terminal coupled to the first current source. The fourth switch has a control terminal triggered by an inverse signal of the second control signal and a first terminal coupled to the second current source. The reset switch has a first terminal coupled to second terminals of the third switch and the fourth switch and a second terminal coupled to second terminals of the first switch and the second switch. The inverse reset switch has a control terminal triggered by the inverse reset signal, a first terminal coupled to the second terminal of the reset switch and a second terminal coupled to an output terminal of the charge pump. The capacitance has a first terminal coupled to the output terminal of the charge pump and a second terminal coupled to a ground voltage. The voltage-controlled delay line has a control terminal coupled to the first terminal of the capacitance, an input terminal for receiving the first frequency signal and an output terminal for providing the second frequency signal to the phase frequency detector.

According to a fifth aspect of the present disclosure, a charge pump is provided. The charge pump provides an output signal according to a first control signal, a second control signal and an inverse reset signal. The charge pump includes a first current source, a second current source, a first switch, a second switch, a third switch, a fourth switch, an operational amplifier, an inverse reset switch and a capacitance. The first switch has a control terminal triggered by the first control signal and a first terminal coupled to the first current source. The second switch has a control terminal triggered by the second control signal and a first terminal coupled to the second current source. The third switch has a control terminal triggered by an inverse signal of the first control signal and a first terminal coupled to the first current source. The fourth switch has a control terminal triggered by an inverse signal of the second control signal and a first terminal coupled to the second current. The operational amplifier has a first terminal coupled to second terminals of the third switch and the fourth switch and a second terminal coupled to second terminals of the first switch and the second switch. The inverse reset switch has a control terminal triggered by the inverse reset signal, a first terminal coupled to the second terminal of the operational amplifier and a second terminal coupled to an output terminal of the charge pump. The capacitance has a first terminal coupled to the output terminal of the charge pump and a second terminal coupled to a ground voltage.

The invention will become apparent from the following detailed description of the preferred but non-limiting embodiments. The following description is made with reference to the accompanying drawings.

DETAILED DESCRIPTION OF THE INVENTION

The disclosure discloses a charge pump and a phase detection device, a phase-locked loop (PLL) and a delay-locked loop (DLL) using the same, capable of solving an unmatched current problem of the charge pump by an additional inverse reset signal and an additional inverse reset switch, thus the charge pump is not limited to frequency bandwidth limitations of traditional analog circuits, greatly improving the operating speed and suitable for high-speed applications.

Figure 1:
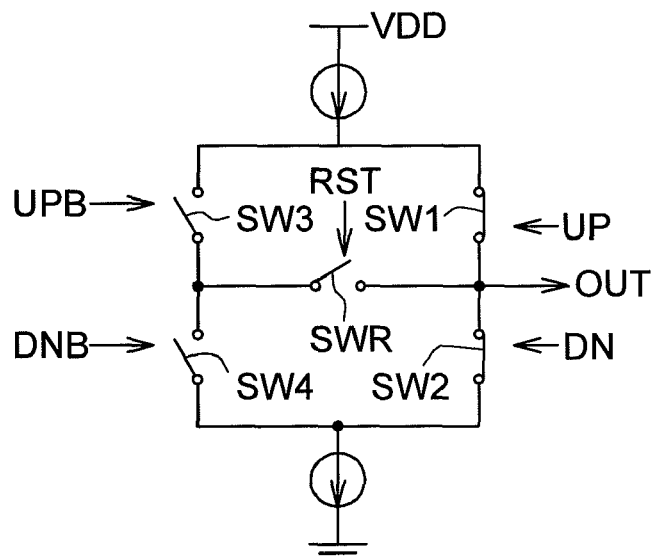
FIG. 1 shows a schematic illustration of an example of a traditional charge pump.
Figure 2:
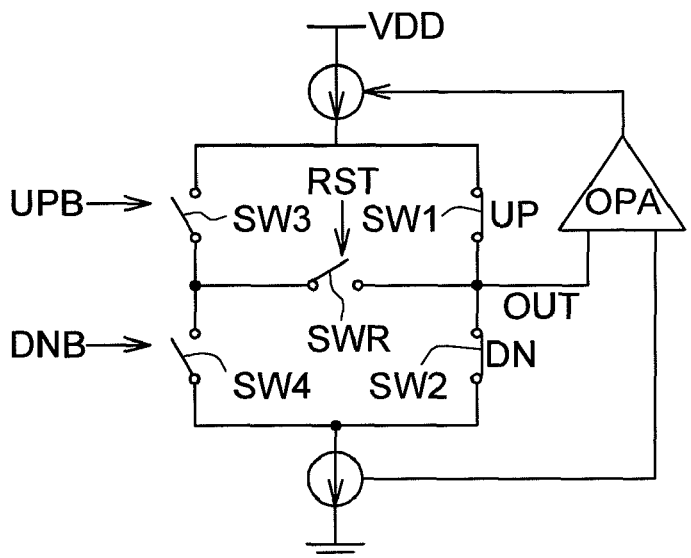
FIG. 2 shows a schematic illustration of another example of a traditional charge pump.
Figure 3:
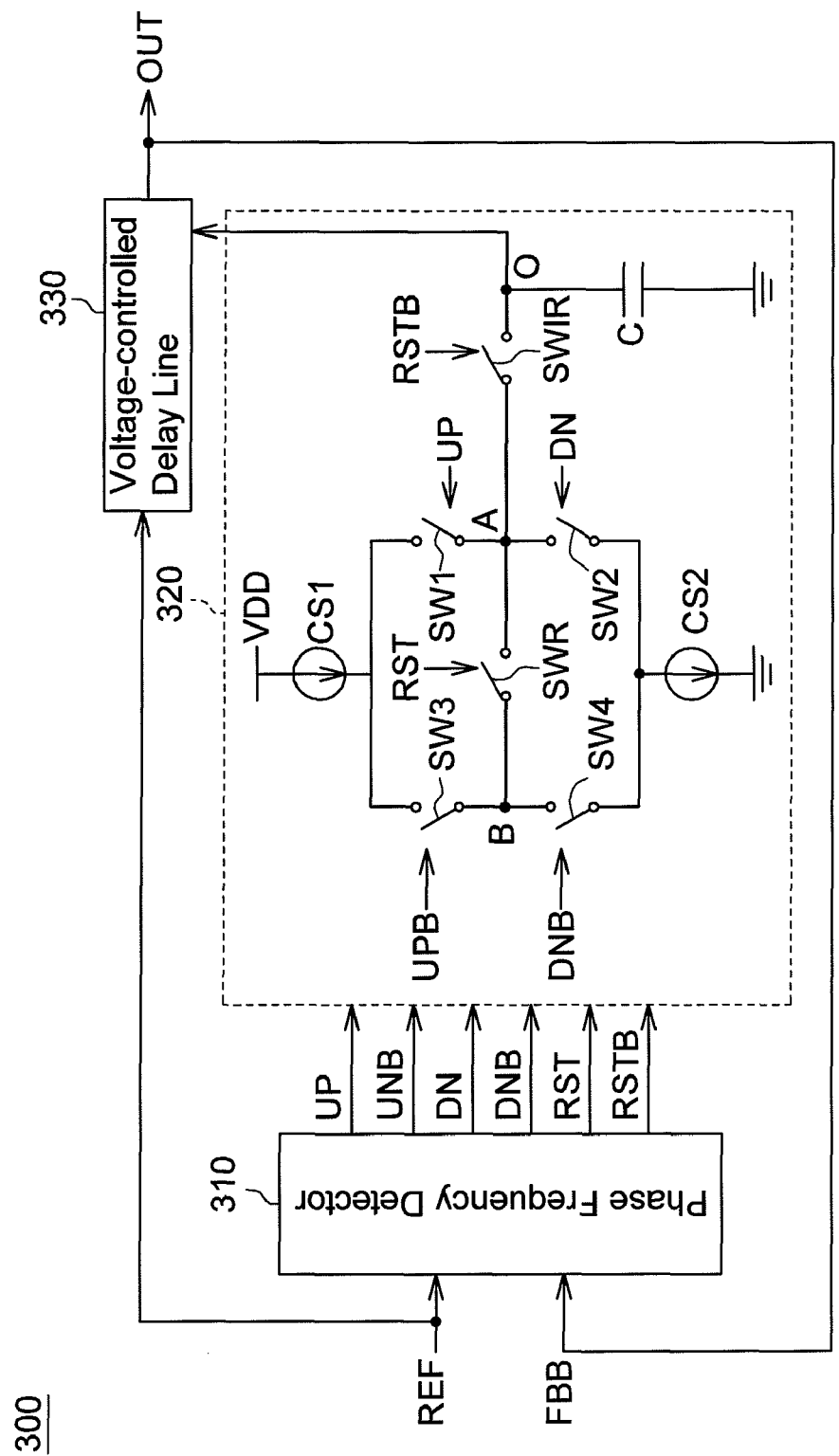
FIG. 3 shows a block diagram illustrating a DLL according to an embodiment.

Referring to FIG. 3, a block diagram illustrating a DLL according to an embodiment is shown. A DLL 300 includes a phase frequency detector (PFD) 310, a charge pump 320 and a voltage-controlled delay line (VCDL) 330. The PFD 310 detects a relationship between phases of a first frequency signal REF and a second frequency signal FBB, and outputs a first control signal UP, a second control signal DN and an inverse reset signal RSTB according to a detection result. The charge pump 320 includes a first current source CS1, a second current source CS2, a first switch SW1, a second switch SW2, a third switch SW3, a fourth switch SW4, a reset switch SWR, an inverse reset switch SWIR and a capacitance C.

A first control terminal of the first switch SW1 is triggered by the first control terminal UP. A first terminal of the first switch SW is coupled to the first current source CS1. A control terminal of the second switch SW2 is triggered by the second control terminal DN. A first terminal of the second switch SW2 is coupled to the second current source CS2. A control terminal of the third switch SW3 is triggered by an inverse signal UPB of the first control signal UP, a first terminal of the third switch SW3 is coupled to the first current source CS1, and a second terminal of the third switch SW3 is coupled to the node B. A control terminal of the fourth switch SW4 is triggered by an inverse signal DNB of the second control signal DN, a first terminal of the fourth switch SW4 is coupled to the second current source CS2, and a second terminal of the fourth switch SW4 is coupled to the node B.

A first terminal of the reset switch SWR is coupled to a second terminal of the third switch SW3 and a second terminal of the fourth switch SW4, (that is, the node B), and a second terminal of the reset switch SWR is coupled to a second terminal of the first switch SW1 and a second terminal of the second switch SW2 (that is, a node A). A control terminal of the inverse reset switch SWIR is triggered by the inverse reset signal RSTB, an inverse signal of a reset signal RST. A first terminal of the inverse rest switch SWIR is coupled to a second terminal of the reset switch SWR (that is, the node A), and a second terminal of the inverse reset switch SWIR is coupled to an output terminal of the charge pump 320 (that is, a node O). A first terminal of the capacitance C is coupled to the output terminal of the charge pump 320, and a second terminal of the capacitance C is coupled to a ground voltage. The above inverse signals UPB, DNB and RSTB can be provided by the PFD 310. In some embodiments that the PFD does not provide the inverse signals UPB, DNB and RSTB, an inverter can be disposed in the charge pump 310 to invert the control signals UP and DN and the reset signal RST to obtain the inverse signals UPB, DNB and RSTB.

The first switch SW1, the second switch SW2 and the reset switch SWR are turned on during a reset period $T_r$, and the third switch SW3, the fourth switch SW4 and the inverse reset switch SWIR are turned on during a first period $T_1$ next to the reset period $T_r$. The said reset period $T_r$ can be defined by the internal reset signal RST of the PFD 310. In some embodiments that the PFD 310 does not provide the reset signal RST, a logic circuit can be disposed in the charge pump 320 to detect falling edges of the control signals UP or DN, such that the logic circuit can define the reset period $T_r$ according to the falling edges of the control signals UP or DN.

A input terminal of the VCDL 330 receives the first frequency signal REF. The output terminal (the node O) of the charge pump 320 outputs an analog voltage to control delay time of the VCDL 330 via the capacitance C. Therefore, the VCDL 330 delays the first frequency signal REF and provides a corresponding output frequency signal OUT at its output terminal to a next stage circuit (not shown). The output frequency signal OUT will be taken as the second frequency signal FBB to be feedback to the PFD 310. The said VCDL 330 is known to the public, so related description thereof will be omitted.

Figure 4:
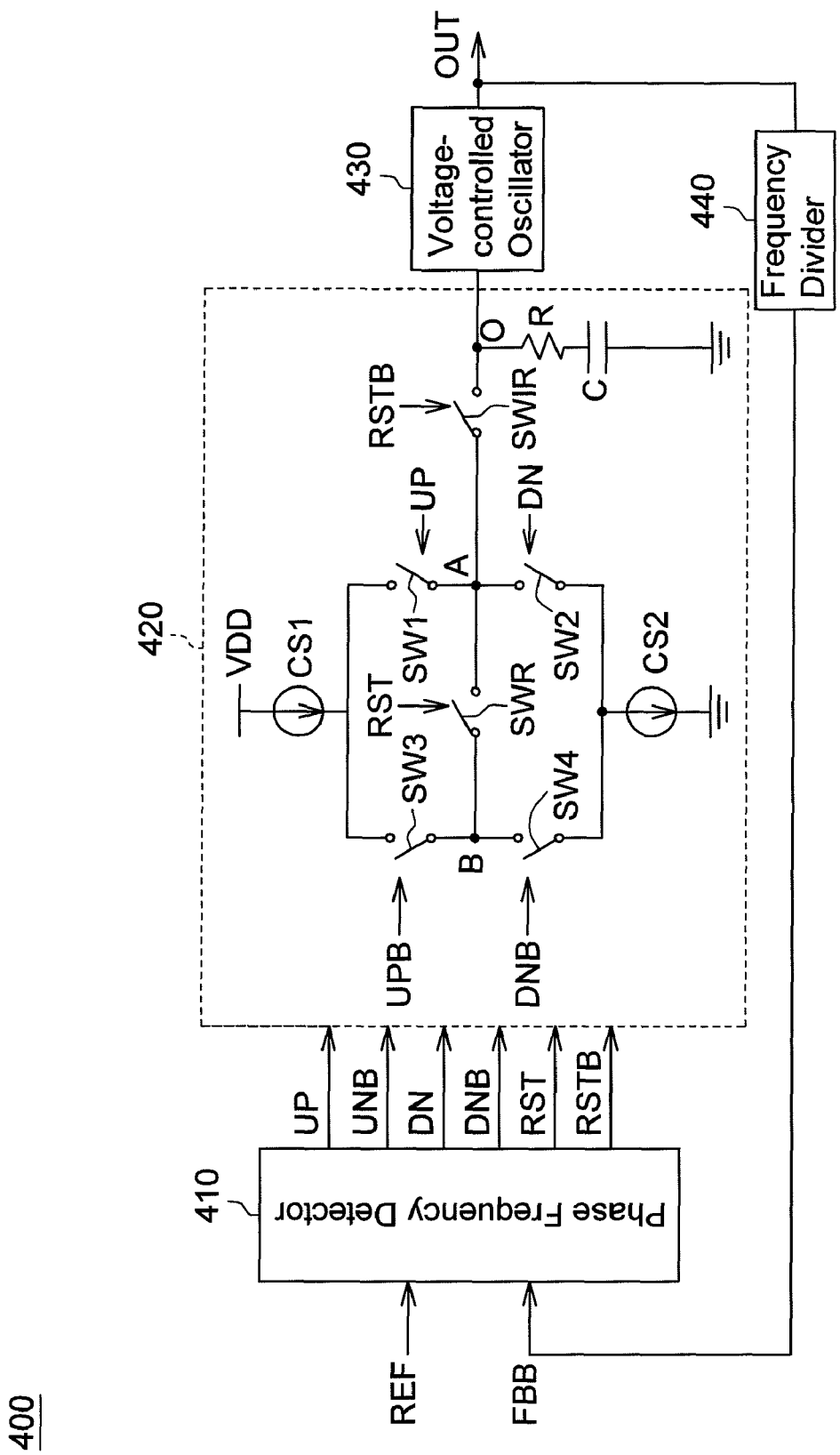
FIG. 4 shows a block diagram illustrating a PLL according to an embodiment.

Referring to FIG. 4, a block diagram illustrating a PLL according to an embodiment is shown. The PLL 400 includes a PFD 410, a charge pump 420, a voltage-controlled oscillator (VCO) 430 and a frequency divider 440. The PFD 410 and the charge pump 420 can be referred to the related description of the FPD 310 and the charge pump 320 in FIG. 3, so detailed description thereof will be omitted. An input terminal of the VCO 430 is coupled to an input terminal (the node O) of the charge pump 420. There is further a resistance R coupled between the capacitance C and the node O. A control terminal of the VCO 430 receives an analog voltage outputted from an output terminal of the charge pump 420 via the resistance R and the capacitance C, and an oscillation frequency of the VCO 430 is controlled by the analog voltage. Therefore, the VCO 430 provides a corresponding output frequency signal OUT at its output terminal to a next stage circuit (not shown). An input terminal of the frequency divider 440 is coupled to the output terminal of the VCO 430 to perform a frequency dividing operation on the output frequency signal OUT. The frequency divider 440 provides a corresponding second frequency signal FBB at its output terminal to the PFD 410. The said VCO 430 and frequency divider 440 are known to the public, so related description thereof will be omitted.

Figure 5:
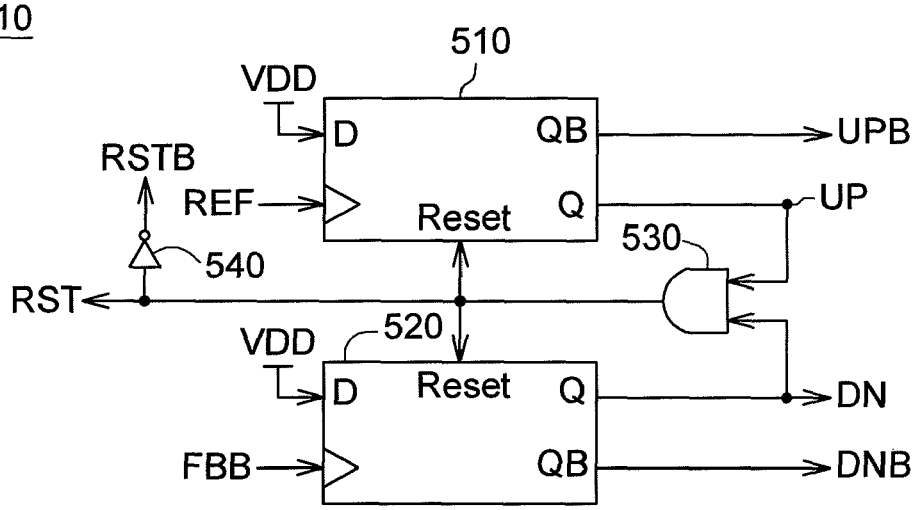
FIG. 5 shows a block diagram illustrating a PFD according to an embodiment.

Referring to FIG. 5, a block diagram illustrating a PFD according to an embodiment is shown. Although only the PFD 310 is shown in FIG. 5, the circuit architecture of the PFD 410 is the same. The PFD 310 includes a first flip-flop 510, a second flip-flop 520, an AND gate 530 and an inverter 540. An input terminal D of the first flip-flop 510 receives a working voltage VDD, a trigger terminal of the first flip-flop 510 receives the first frequency signal REF, an inverse output terminal QB of the first flip-flop 510 outputs the inverse signal UPB, and an output terminal Q of the first flip-flop 510 outputs the first control signal UP. An input terminal D of the second flip-flop 520 receives the working voltage VDD, a trigger terminal of the second flip-flop 520 receives the second frequency signal FBB, an inverse output terminal QB of the second flip-flop 520 outputs the inverse signal DNB, and an output terminal Q of the second flip-flop 520 outputs the second control signal DN. A first input terminal and a second input terminal of the AND gate 530 are respectively coupled to the output terminals Q of the first flip-flop 510 and the second flip-flop 520, an output terminal of the AND gate 530 outputs the reset signal RST to the control terminal of the reset switch SWR, the trigger terminals of the first flip-flop 510 and the second flip-flop 520 and an input terminal of the inverter 540. An output terminal of the inverter 540 outputs the inverse reset signal RSTB.

Figure 6A:
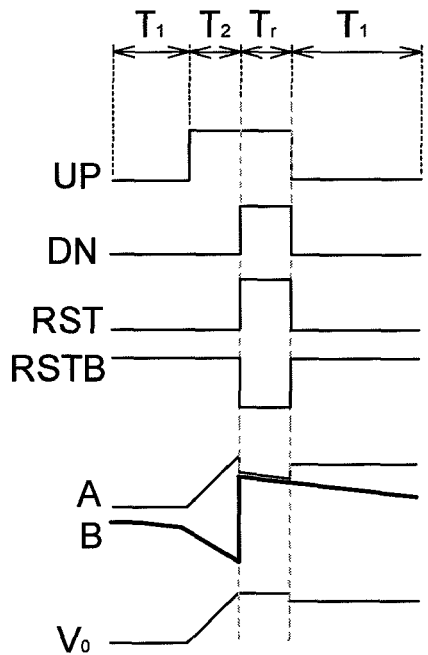
FIG. 6A shows a signal timing diagram of an example of the PFD and the charge pump under a condition that a discharge current is larger than a charge current according to an embodiment.
Figure 6B:
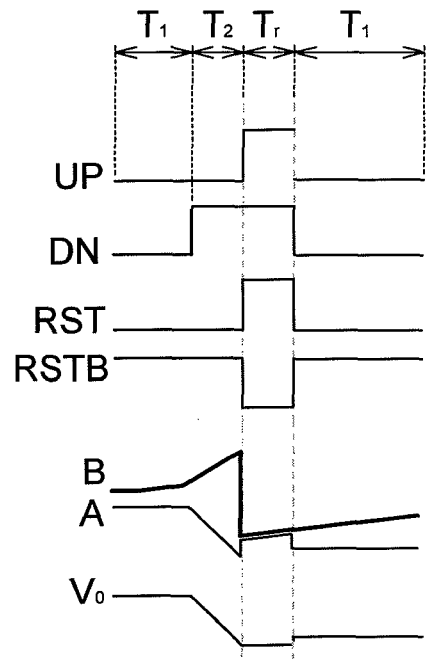
FIG. 6B shows a signal timing diagram of an example of the PFD and the charge pump under a condition that a charge current is larger than a discharge current according to an embodiment.

Referring to FIGS. 6A and 6B, a signal timing diagram of an example of the PFD and the charge pump under a condition that a discharge current is larger than a charge current according to an embodiment is shown in FIG. 6A, and a signal timing diagram of an example of the PFD and the charge pump under a condition that a charge current is larger than a discharge current according to an embodiment is shown in FIG. 6B. Referring concurrently now to FIG. 5, rising edges of the first frequency signal REF and the second frequency signal FBB will respectively trigger the first flip-flop 510 and the second flip-flop 520. The first flip-flop 510 and the second flip-flop 520 will respectively output the first control signal UP and the second control signal DN correspondingly after being triggered.

As the first flip-flop 510 and the second flip-flop 520 are both triggered, the AND gate 530 will output the reset signal RST to reset the first control signal UP and the second control signal DN to a logical low level. That is, the PFD 310/410 will detect the falling edges of the first control signal UP or the second control signal DN, and then accordingly define the reset period $T_r$. When the phase of the first frequency signal REF leads the phase of the second frequency signal FBB, the corresponding condition that the discharge current is larger than the charge current is the same as shown in FIG. 6A; when the phase of the second frequency signal FBB leads the phase of the first frequency signal REF, the corresponding condition that the charge current is larger than the discharge current is the same as shown in FIG. 6B.

In FIG. 6A, the third switch SW3, the fourth switch SW4 and the inverse reset switch SWIR are turned on in a first period $T_1$. Meanwhile, the current of the charge pump 320/420 flows through the third switch SW3 and the fourth switch SW4. Because the discharge current is larger than the charge current in the embodiment, the voltage level of the node B floats to the ground voltage in the first period $T_1$. The first switch SW1, the fourth switch SW4 and the inverse reset switch SWIR are turned on in a second period $T_2$, the current of the charge pump 320/420 flows through the node A to charge the capacitance C, so that the voltage level $V_O$ of the node O will increase. Meanwhile, the discharge current discharges the node B, so that the voltage level of the node B keeps decreasing.

The first switch SW1, the second switch SW2 and the reset switch SWR are turned on in a reset period $T_r$, so that the node A and the node B are short. Because it is open between the node A and the capacitance C, the node A and the node B perform a charge sharing operation to be the same voltage level. Thus, a current error in the reset period $T_r$ is limited to circuits of the charge pump 320/420 without influencing the voltage level of the capacitance C. Because the charge current is larger than the discharge current in the embodiment, the balanced voltage level will float to the ground voltage. Thereafter, it backs to the first period $T_1$, in which the third switch SW3, the fourth switch SW4 and the inverse reset switch SWIR are turned on.

Because it is open between the node A and the node B, the node B keeps discharging in the first period $T_1$ due to the un-matching currents. Meanwhile, the node A and the node C perform a charge sharing operation. Because a parasitic capacitance of the node A is far less than the capacitance C, the balanced voltage level is finally almost the same as the charged voltage level during the second period $T_2$. Following this process of reasoning, the loop will keep repeating the above procedure until locked. Therefore, even if the discharge current is larger than the charge current, the voltage level $V_O$ of the output terminal of the charge pump 320/420 is ripple-free without considering leakage currents as the phase is locked. That is, there is no spur occurred in the frequency spectrum.

In FIG. 6B, the third switch SW3, the fourth switch SW4 and the inverse reset switch SWIR are turned on in a first period $T_1$. Meanwhile, the current of the charge pump 320/420 flows through the third switch SW3 and the fourth switch SW4. Because the charge current is larger than the discharge current in the embodiment, the voltage level of the node B floats to the working voltage VDD in the first period $T_1$. The second switch SW2, the third switch SW3 and the inverse reset switch SWIR are turned on in a second period $T_2$. The current of the charge pump 320/420 flows through the node A to discharge the capacitance C, so that the voltage level $V_O$ of the node O will decrease. Meanwhile, the charge current charges the node B, so that the voltage level of the node B keeps increasing.

The first switch SW1, the second switch SW2 and the reset switch SWR are turned on in a reset period $T_r$, so that the node A and the node B are short. Because it is open between the node A and the capacitance C, the node A and the node B perform a charge sharing operation to be the same voltage level. Thus, a current error in the reset period $T_r$ is limited to circuits of the charge pump 320/420 without influencing the voltage level of the capacitance C. Because the charge current is larger than the discharge current in the embodiment, the balanced voltage level will float to the working voltage VDD. Thereafter, it backs to the first period $T_1$, in which the third switch SW3, the fourth switch SW4 and the inverse reset switch SWIR are turned on.

Because it is open between the node A and the node B, the node B keeps charging in the first period $T_1$ due to the un-matching currents. Meanwhile, the node A and the node C perform a charge sharing operation. Because a parasitic capacitance of the node A is far less than the capacitance C, the balanced voltage level is finally almost the same as the discharged voltage level during the second period $T_2$. Following this process of reasoning, the loop will keep repeating the above procedure until locked. Therefore, even if the charge current is larger than the discharge current, the voltage level $V_O$ of the output terminal of the charge pump 320/420 is ripple-free without considering leakage currents as the phase is locked. That is, there is no spur occurred in the frequency spectrum.

To sum it all up, in the reset period $T_r$, the first switch SW1, the second switch SW2 and the reset switch SWR are turned on, and the third switch SW3, the fourth switch SW4 and the inverse reset switch SWIR are turned off, so that it is open between the node A and the capacitance C. Hence, the current error in the reset period $T_r$ is limited to circuits of the charge pump 320/420 without influencing the voltage level of the capacitance C. Therefore, the first switch SW1, the second switch SW2 and the reset switch SWR are all turned off as the reset period $T_r$ ends, so that the node A is electrically connected to the node O to make the balanced voltage level is finally almost the same as the discharged voltage level during the second period $T_2$. Consequently, the embodiment is able to prevent the voltage level $V_O$ of the output terminal from generating ripples as the phase is locked, thus the charge pump 320/420 in the embodiment may further be suitable for high-speed applications and not limited to frequency bandwidth limitations of traditional analog circuits so that the operating speed is greatly improved.

In addition, the PFD 310/410 substantially determines two inputted clock signals to output the first control signal UP and the second control signal DN for controlling the capacitance C of the charge pump 320/420 to charge/discharge. When the reference frequency (REF) leads the feedback signal (FBB), the speed of the VCO 430 increases or the delay of the VCDL 330 decreases. Likewise, when the feedback signal (FBB) leads the reference frequency (REF), the speed of the VCO 430 decreases or the delay of the VCDL 330 increases. As the loop is locked and there is no phase difference between the reference frequency (REF) and the feedback signal (FBB), the first control signal UP and the second control signal DN both output a pulse to eliminate a deadzone of the system. The deadzone is resulted from uncompleted open switches or abnormally open switches in the charge pump 320/420, caused by over-narrow widths of the first control signal UP and the second control signal DN as the phase difference is small. Hence, output of the pulse is a necessary condition of normal operations of the DLL 300 or the PLL 400, or the system will not make a judgment normally as the phase difference is very small.

Figure 7:
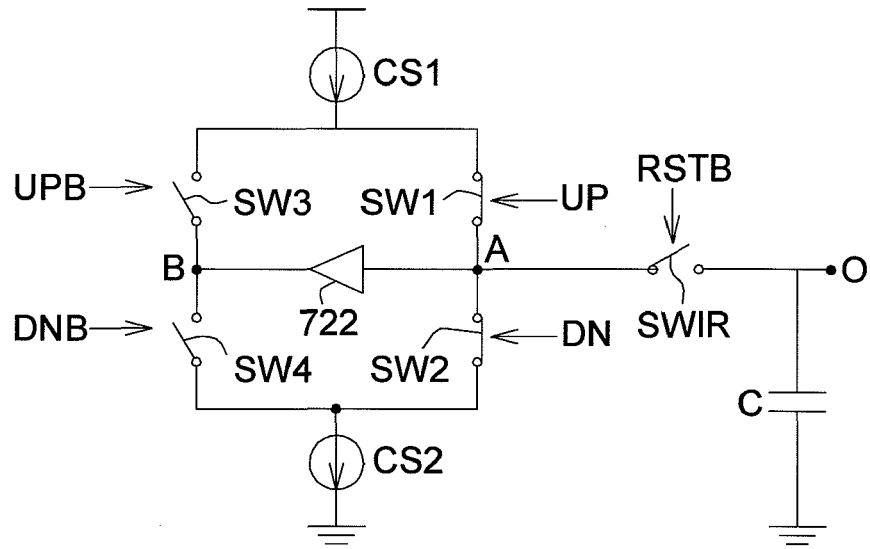
FIG. 7 shows a schematic illustration of another example of the charge pump 320/420 according to an embodiment.

The implement ways of the charge pump 320/420 can be modified according to design requirements and the above embodiments by people having ordinary skills in the art. For example, a schematic illustration of another example of the charge pump 320/420 according to an embodiment is shown in FIG. 7. In FIG. 7, a charge pump 720 includes a first current source CS1, a second current source CS2, a first switch SW1, a second switch SW2, a third switch SW3, a fourth switch SW4, an inverse reset switch SWIR, a capacitance C and an operational amplifier 722. The first switch SW1, the second switch SW2, the third switch SW3, the fourth switch SW4, the inverse reset switch SWIR can be referred to the related description of the above embodiments, so detailed description thereof will be omitted.

Figure 8A:
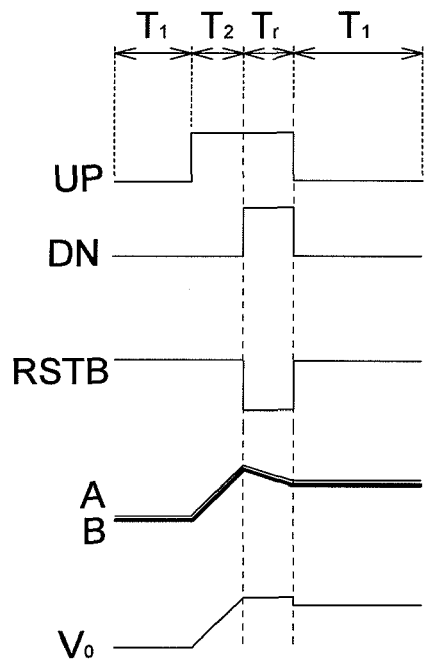
FIG. 8A shows a signal timing diagram of another example of the PFD and the charge pump under a condition that a discharge current is larger than a charge current according to an embodiment.
Figure 8B:
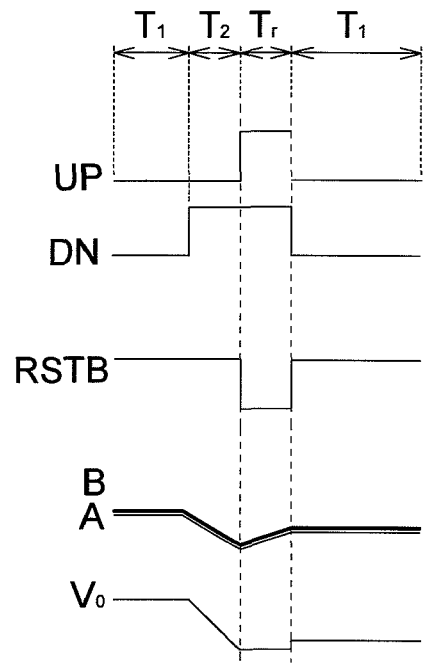
FIG. 8B shows a signal timing diagram of another example of the PFD and the charge pump under a condition that a charge current is larger than a discharge current according to an embodiment.

Referring to FIGS. 8A and 8B, a signal timing diagram of another example of the PFD and the charge pump under a condition that a discharge current is larger than a charge current according to an embodiment is shown in FIG. 8A, and a signal timing diagram of another example of the PFD and the charge pump under a condition that a charge current is larger than a discharge current according to an embodiment is shown in FIG. 8B. It can be obtained in FIGS. 8A and 8B, the node A and the node B perform no charge sharing operation during the reset period $T_r$, hence the voltage level of the node B is forced to be equal with the voltage level of the node A due to the operational amplifier 722. Referring concurrently now to FIG. 5, rising edges of the first frequency signal REF and the second frequency signal FBB will respectively trigger the first flip-flop 510 and the second flip-flop 520. The first flip-flop 510 and the second flip-flop 520 will respectively output the first control signal UP and the second control signal DN correspondingly after being triggered. Therefore, even if the discharge current is different with the charge current, the voltage level $V_O$ of the output terminal of the charge pump 720 is ripple-free without considering leakage currents as the phase is locked. That is, there is no spur occurred in the frequency spectrum.

Figure 9:
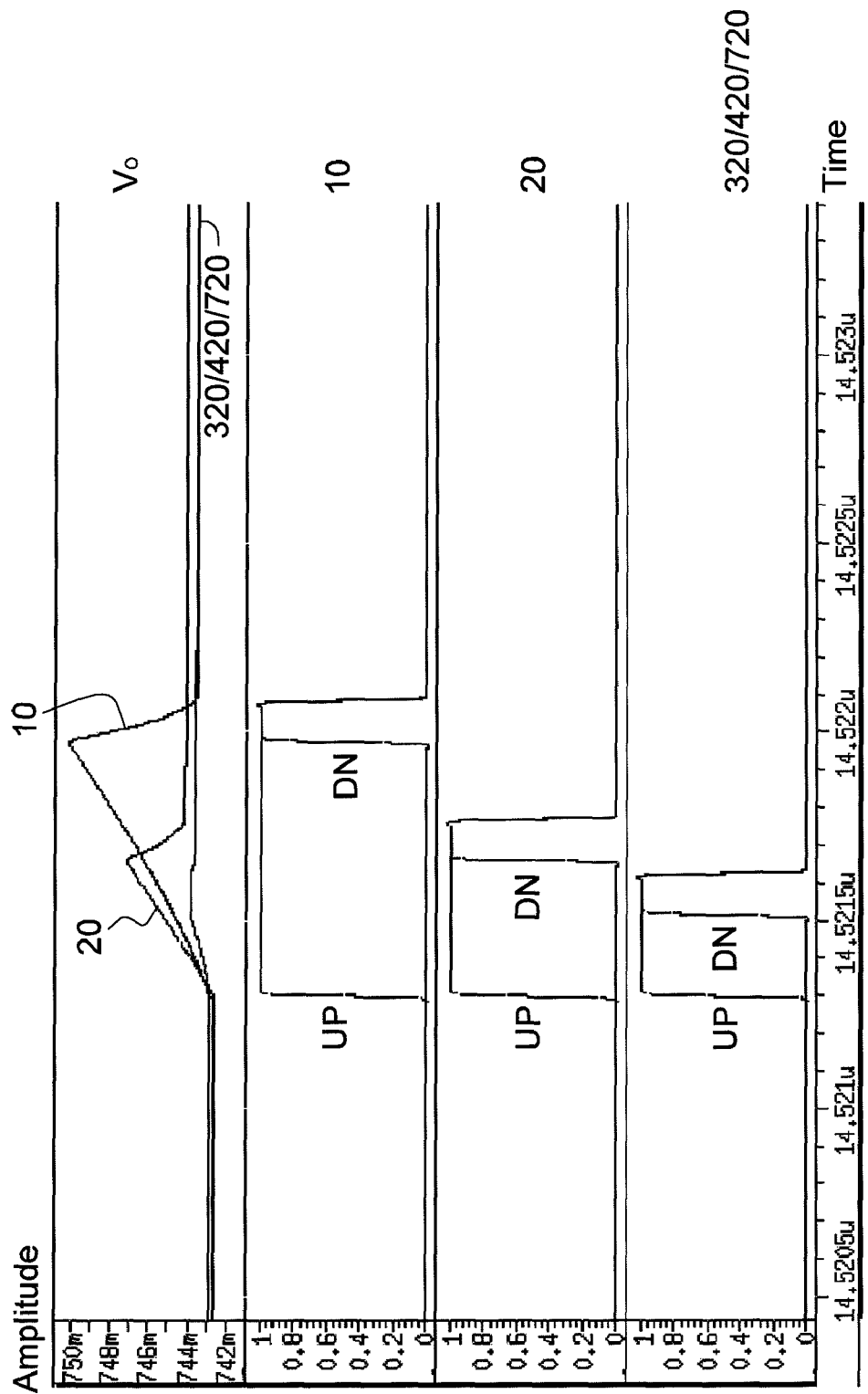
FIG. 9 shows a simulation result comparison graph between a traditional charge pump and a charge pump according to an embodiment.

Referring to FIG. 9, a simulation result comparison graph between a traditional charge pump and a charge pump according to an embodiment is shown. It can be obtained in FIG. 9 that compared with the traditional charge pumps 10 and 20, the charge pumps 320, 420 and 720 in the embodiments not only reduce the generation of the ripples, but also decrease the phase error between the first control signal UP and the second control signal DN.

The charge pump and the phase detection device, the phase-locked loop (PLL) and the delay-locked loop (DLL) using the same disclosed in the disclosure solves the unmatched current problem of the charge pump by an additional inverse reset signal and an additional inverse reset switch.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A charge pump for providing an output signal according to a first control signal, a second control signal and an inverse reset signal, the charge pump comprising:
a first current source;
a second current source;
a first switch having a control terminal triggered by the first control signal and a first terminal coupled to the first current source;
a second switch having a control terminal triggered by the second control signal and a first terminal coupled to the second current source;
a third switch having a control terminal triggered by an inverse signal of the first control signal and a first terminal coupled to the first current source;
a fourth switch having a control terminal triggered by an inverse signal of the second control signal and a first terminal coupled to the second current source;
a reset switch having a first terminal coupled to second terminals of the third switch and the fourth switch and a second terminal coupled to second terminals of the first switch and the second switch;
an inverse reset switch having a control terminal triggered by the inverse reset signal, a first terminal coupled to the second terminal of the reset switch and a second terminal coupled to an output terminal of the charge pump; and
a capacitance having a first terminal coupled to the output terminal of the charge pump and a second terminal coupled to a ground voltage.

2. The charge pump according to claim 1, wherein the first switch, the second switch and the reset switch are turned on during a reset period, and the third switch, the fourth switch and the inverse reset switch are turned on during a first period next to the reset period.

3. The charge pump according to claim 1, wherein a control terminal of the reset switch is triggered by a reset signal, an inverse signal of the inverse reset signal.

4. A phase detection apparatus, comprising:
a phase frequency detector for detecting a relationship between phases of a first frequency signal and a second frequency signal and outputting a first control signal, a second control signal and an inverse reset signal according to a detection result; and
a charge pump, comprising:
a first current source;
a second current source;
a first switch having a control terminal triggered by the first control signal and a first terminal coupled to the first current source;
a second switch having a control terminal triggered by the second control signal and a first terminal coupled to the second current source;
a third switch having a control terminal triggered by an inverse signal of the first control signal and a first terminal coupled to the first current source;
a fourth switch having a control terminal triggered by an inverse signal of the second control signal and a first terminal coupled to the second current source;
a reset switch having a first terminal coupled to second terminals of the third switch and the fourth switch and a second terminal coupled to second terminals of the first switch and the second switch;
an inverse reset switch having a control terminal triggered by the inverse reset signal, a first terminal coupled to the second terminal of the reset switch and a second terminal coupled to an output terminal of the charge pump; and a capacitance having a first terminal coupled to the output terminal of the charge pump and a second terminal coupled to a ground voltage.

5. The phase detection apparatus according to claim 4, wherein the first switch, the second switch and the reset switch are turned on during a reset period, and the third switch, the fourth switch and the inverse reset switch are turned on during a first period next to the reset period.

6. The phase detection apparatus according to claim 4, wherein the phase frequency detector further outputs a reset signal, an inverse signal of the inverse reset signal, according to the detection result, and a control terminal of the reset switch is triggered by the reset signal.

7. The phase detection apparatus according to claim 6, wherein the phase frequency detector comprises:
 a first flip-flop having an input terminal for receiving a first voltage, a trigger terminal for receiving the first frequency signal and an output terminal for outputting the first control signal;
 a second flip-flop having an input terminal for receiving a first voltage, a trigger terminal for receiving the second frequency signal and an output terminal for outputting the second control signal; and
 an AND gate having a first input terminal and a second input terminal respectively coupled to the output terminals of the first flip-flop and the second flip-flop and an output terminal for outputting the reset signal to the control terminal of the reset switch and reset terminals of the first flip-flop and the second flip-flop.

8. The phase detection apparatus according to claim 7, wherein the phase frequency detector inverts the reset signal into the inverse reset signal via an inverter and outputs the inverse reset signal to the control terminal of the inverse reset switch.

9. A phase-locked loop, comprising:
 a phase frequency detector for detecting a relationship between phases of a first frequency signal and a second frequency signal and outputting a first control signal, a second control signal and an inverse reset signal according to a detection result;
 a charge pump, comprising:
  a first current source;
  a second current source;
  a first switch having a control terminal triggered by the first control signal and a first terminal coupled to the first current source;
  a second switch having a control terminal triggered by the second control signal and a first terminal coupled to the second current source;
  a third switch having a control terminal triggered by an inverse signal of the first control signal and a first terminal coupled to the first current source;
  a fourth switch having a control terminal triggered by an inverse signal of the second control signal and a first terminal coupled to the second current source;
  a reset switch having a first terminal coupled to second terminals of the third switch and the fourth switch and a second terminal coupled to second terminals of the first switch and the second switch;
  an inverse reset switch having a control terminal triggered by the inverse reset signal, a first terminal coupled to the second terminal of the reset switch and a second terminal coupled to an output terminal of the charge pump; and
  an element, formed by capacitance and resistance in series, having a first terminal coupled to the output terminal of the charge pump and a second terminal coupled to a ground voltage;
 a voltage-controlled oscillator having an input terminal coupled to the output terminal of the charge pump; and
 a frequency divider having an input terminal coupled to an output terminal of the voltage-controlled oscillator and an output terminal for providing the second frequency signal to the phase frequency detector.

10. The phase-locked loop according to claim 9, wherein the first switch, the second switch and the reset switch are turned on during a reset period, and the third switch, the fourth switch and the inverse reset switch are turned on during a first period next to the reset period.

11. The phase-locked loop according to claim 9, wherein the phase frequency detector comprises:
 a first flip-flop having an input terminal for receiving a first voltage, a trigger terminal for receiving the first frequency signal and an output terminal for outputting the first control signal;
 a second flip-flop having an input terminal for receiving a first voltage, a trigger terminal for receiving the second frequency signal and an output terminal for outputting the second control signal; and
 an AND gate having a first input terminal and a second input terminal respectively coupled to the output terminals of the first flip-flop and the second flip-flop and an output terminal for outputting the reset signal to the control terminal of the reset switch and reset terminals of the first flip-flop and the second flip-flop.

12. The phase-locked loop according to claim 11, wherein the phase frequency detector inverts the reset signal into the inverse reset signal via an inverter and outputs the inverse reset signal to the control terminal of the inverse reset switch.

13. A delay-locked loop, comprising:
 a phase frequency detector for detecting a relationship between phases of a first frequency signal and a second frequency signal and outputting a first control signal, a second control signal and an inverse reset signal according to a detection result; and
 a charge pump, comprising:
  a first current source;
  a second current source;
  a first switch having a control terminal triggered by the first control signal and a first terminal coupled to the first current source;
  a second switch having a control terminal triggered by the second control signal and a first terminal coupled to the second current source;
  a third switch having a control terminal triggered by an inverse signal of the first control signal and a first terminal coupled to the first current source;
  a fourth switch having a control terminal triggered by an inverse signal of the second control signal and a first terminal coupled to the second current source;
  a reset switch having a first terminal coupled to second terminals of the third switch and the fourth switch and a second terminal coupled to second terminals of the first switch and the second switch;
  an inverse reset switch having a control terminal triggered by the inverse reset signal, a first terminal coupled to the second terminal of the reset switch and a second terminal coupled to an output terminal of the charge pump; and a capacitance having a first terminal coupled to the output terminal of the charge pump and a second terminal coupled to a ground voltage; and a voltage-controlled delay line having a control terminal coupled to the first terminal of the capacitance, an input terminal for receiving the first frequency signal and an output terminal for providing the second frequency signal to the phase frequency detector.

14. The delay-locked loop according to claim 13, wherein the first switch, the second switch and the reset switch are turned on during a reset period, and the third switch, the fourth switch and the inverse reset switch are turned on during a first period next to the reset period.

15. The delay-locked loop according to claim 13, wherein the phase frequency detector comprises:

a first flip-flop having an input terminal for receiving a first voltage, a trigger terminal for receiving the first frequency signal and an output terminal for outputting the first control signal;

a second flip-flop having an input terminal for receiving a first voltage, a trigger terminal for receiving the second frequency signal and an output terminal for outputting the second control signal; and an AND gate having a first input terminal and a second input terminal respectively coupled to the output terminals of the first flip-flop and the second flip-flop and an output terminal for outputting the reset signal to the control terminal of the reset switch and reset terminals of the first flip-flop and the second flip-flop.

16. The delay-locked loop according to claim 13, wherein the phase frequency detector inverts the reset signal into the inverse reset signal via an inverter and outputs the inverse reset signal to the control terminal of the inverse reset switch.

17. A charge pump for providing an output signal according to a first control signal, a second control signal and an inverse reset signal, the charge pump comprising:

a first current source;

a second current source;

a first switch having a control terminal triggered by the first control signal and a first terminal coupled to the first current source;

a second switch having a control terminal triggered by the second control signal and a first terminal coupled to the second current source;

a third switch having a control terminal triggered by an inverse signal of the first control signal and a first terminal coupled to the first current source;

a fourth switch having a control terminal triggered by an inverse signal of the second control signal and a first terminal coupled to the second current source;

an operational amplifier having a first terminal coupled to second terminals of the third switch and the fourth switch and a second terminal coupled to second terminals of the first switch and the second switch;

an inverse reset switch having a control terminal triggered by the inverse reset signal, a first terminal coupled to the second terminal of the operational amplifier and a second terminal coupled to an output terminal of the charge pump; and a capacitance having a first terminal coupled to the output terminal of the charge pump and a second terminal coupled to a ground voltage.

18. The charge pump according to claim 17, wherein the first switch and the second switch are turned on during a reset period, and the third switch, the fourth switch and the inverse reset switch are turned on during a first period next to the reset period.

* * * * *